US009594101B2

(12) United States Patent
Schneegans et al.

(10) Patent No.: US 9,594,101 B2
(45) Date of Patent: Mar. 14, 2017

(54) APPARATUS FOR MEASURING THE LOCAL ELECTRICAL RESISTANCE OF A SURFACE

(75) Inventors: Olivier Schneegans, Antony (FR); Pascal Chretien, Vélizy Villacoublay (FR); Frédéric Houzé, Chevreuse (FR)

(73) Assignees: Centre National De La Recherche Scientifique, Paris (FR); Ecole Superieure D'Electricite, Gif-sur-Yvette (FR)

( * ) Notice: Subject to any disclaimer, the term of this patent is extended or adjusted under 35 U.S.C. 154(b) by 1080 days.

(21) Appl. No.: 13/696,125

(22) PCT Filed: May 3, 2011

(86) PCT No.: PCT/IB2011/051951
§ 371 (c)(1),
(2), (4) Date: Jan. 8, 2013

(87) PCT Pub. No.: WO2011/138738
PCT Pub. Date: Nov. 10, 2011

(65) Prior Publication Data
US 2013/0103335 A1    Apr. 25, 2013

(30) Foreign Application Priority Data

May 5, 2010    (FR) ...................... 10 01940

(51) Int. Cl.
G01R 27/02 (2006.01)
B82Y 35/00 (2011.01)
G01Q 60/30 (2010.01)

(52) U.S. Cl.
CPC .............. G01R 27/02 (2013.01); B82Y 35/00 (2013.01); G01Q 60/30 (2013.01)

(58) Field of Classification Search
CPC .................................................. G01R 27/02
(Continued)

(56) References Cited

U.S. PATENT DOCUMENTS 5,723,981 A * 3/1998 Hellemans ............. B82Y 35/00
                                                       257/E21.531
6,531,371 B2 * 3/2003 Hsu ......................... G11C 11/15
                                                       257/E27.004
(Continued)

OTHER PUBLICATIONS

International Search Report and Written Opinion for Application No. PCT/IB2011/051951 dated.
(Continued)

Primary Examiner — John Breene
Assistant Examiner — Yaritza H Perez Bermudez
(74) Attorney, Agent, or Firm — Alston & Bird LLP

(57) ABSTRACT

Apparatus for measuring the local electrical resistance of a surface, the apparatus comprising:
 a DC voltage source for applying a bias voltage ($V_{pol}$) to the sample (E) for characterizing;
 a measurement circuit (CM) capable of being connected to a conductive probe suitable for coming into contact with a surface (SE) of said sample in order to generate a signal (S) representative of a contact resistance between said conductive probe and said surface of the sample; and
 a control device (CMD) for controlling said measurement circuit;
the apparatus being characterized in that said measurement circuit comprises:
 a measurement resistive two-terminal network ($D_M$) presenting variable resistance and connected between said conductive probe and a ground of the circuit; and
 a calculation unit (UC) for generating said signal representative of a contact resistance between said conductive probe and said surface of the sample as a function of a voltage ($V_s$) across the terminals of said measurement resistive two-terminal network.

15 Claims, 4 Drawing Sheets

(58) Field of Classification Search
USPC .......................................................... 702/65
See application file for complete search history.

(56) References Cited

U.S. PATENT DOCUMENTS 6,612,161 B1     9/2003  Prakash
6,871,559 B2 *   3/2005  Prakash ................ B82Y 35/00
                                                   73/865.9

OTHER PUBLICATIONS

Dickinson, J. T. et al., *The use of Scanning Conduction Microscopy to Probe Abrasion of Insulating Thin Films*, Rev. Sci. Instrum. 66(7), Jul. 1995, 3802-3806.
Houze, F. et al., *Imaging the Local Electrical Properties of Metal Surfaces by Atomic Force Microscopy With Conducting Probes*, Appl. Phys. Lett. 69(13), Sep. 1996, 1975-1977.

* cited by examiner

APPARATUS FOR MEASURING THE LOCAL ELECTRICAL RESISTANCE OF A SURFACE

The invention relates to an apparatus for measuring the local electrical resistance of a surface, or the current flowing between a surface and a probe in contact therewith. The apparatus of the invention is characterized by its large measurement dynamic range, which may be as much as ten decades or more, and also by its acquisition speed, thus making it possible to produce "resistance images" or "current images" of the surface being studied, which images may be coupled with topographic images, in particular when the apparatus is associated with an atomic force microscope or with a mechanical profile meter.

It is known to modify an atomic force microscope so as to enable the local electrical resistance (or conductivity) of the surface of a sample to be measured. That technique makes use of an atomic force microscope operating in contact mode by means of a conductive tip, and a voltage generator that serves to apply a potential difference between the sample and the tip. The current that flows through the tip is measured, thus making it possible to determine the local resistance of the surface at the point of contact. Thus, a "current image" (or in equivalent manner a "resistance image") is acquired at the same time as the topographic image that delivered by the conventional atomic force microscope.

That technique is useful for characterizing materials, welds, electric contacts, etc. As a general rule, these applications require a measurement dynamic range that is very large, extending over several decades (at least six, and often much more than that). In addition, each individual measurement must be taken in a short length of time (of the order of a few milliseconds) in order to make it possible to acquire resistances images that present good resolution, and to do so in a reasonable length of time.

In order to enlarge the range of contact resistance values that can be measured, it is known to perform dynamic range compression by means of a logarithmic amplifier. That solution is not satisfactory since logarithmic amplifiers are difficult to calibrate, thereby degrading measurement accuracy, in particular for measuring very low currents (less than or equal to 1 picoamp (pA)) associated with high values of contact resistance. Furthermore, the dynamic compression that can be obtained by logarithmic amplifiers remains limited: for example in order to reach ten decades, it is possible to have recourse to changes of gauge, leading to delays.

Another solution consists in using a transimpedance amplifier (current-voltage converter) of variable gain. The drawback of that solution is that, in order to measure broad ranges of resistance values, it is necessary to carry out a large number of gain changes during which it is not possible to perform a measurement and which take non-negligible time.

In addition, both logarithmic and transimpedance amplifiers are circuits that are complex and that are difficult to implement, in particular when it is desired to obtain high performance in terms of noise, drift, input impedance, etc., as applies when it is desired to perform very accurate measurements with as great a dynamic range as possible, as in the present circumstances.

Document U.S. Pat. No. 6,871,559 discloses an apparatus for measuring the local electrical resistance of a surface, the apparatus being based on a modified atomic force microscope. The measurement circuit in that apparatus is based on a voltage divider; the use of a logarithmic current amplifier is envisaged in order to improve measurement resolution.

The invention seeks to remedy the drawbacks of the prior art by providing an apparatus for measuring local electrical resistance of a surface, the apparatus presenting a measurement dynamic range that is extremely broad (capable in some circumstances of reaching ten or even 12 decades or more) with an acquisition time that is short (typically less than 1 millisecond (ms)), while being simple and easy to calibrate in very accurate manner.

In accordance with the invention, such an object is achieved by an apparatus for measuring the local electrical resistance of a surface, the apparatus comprising: a direct-current (DC) voltage source for applying a bias voltage to a sample for characterizing; a measurement circuit capable of being connected to a conductive probe suitable for coming into contact with a surface of said sample in order to generate a signal representative of a contact resistance between said conductive probe and said surface of the sample; and a control device for controlling said measurement circuit; the apparatus being characterized in that said measurement circuit comprises: a measurement resistive two-terminal network presenting variable resistance and connected between said conductive probe and a ground of the circuit; and a calculation unit for generating said signal representative of a contact resistance between said conductive probe and said surface of the sample as a function of a voltage across the terminals of said measurement resistive two-terminal network.

The contact resistance (for measuring) and the measurement resistive two-terminal network (known) form a voltage divider. It is simple to show that the voltage across the terminals of the measurement two-terminal network is a non-linear function of the contact resistance. The voltage divider thus serves in extremely simple manner to perform dynamic range compression. By changing the resistance of the measurement two-terminal network, the non-linear dynamic range compression function performed by the divider is changed. This makes it possible to extend the measurement dynamic range.

Advantageously, said measurement resistive two-terminal network may present resistance that is variable in steps. In particular, said measurement resistive two-terminal network may present a plurality of measurement resistors of decreasing resistances, at least one of which may be connected or disconnected selectively between said conductive tip and ground. A resistor can be connected/disconnected very quickly, and that can therefore have practically no impact on acquisition time. In a variant, the resistance of the measurement resistive two-terminal network may be continuously variable.

Said control device may be adapted to modify the resistance of said resistive two-terminal network as a function of a previously measured value of said contact resistance so as to match the measurement range of the apparatus to the resistance for measurement. Preferably, said control device may be adapted to modify the resistance of said resistive two-terminal network in application of a control law with hysteresis.

The apparatus may also include a calibration resistor capable of being connected or disconnected in parallel with the assembly constituted by said sample and said conductive tip. Advantageously said calibration resistor may present resistance that is less than the minimum value of the resistance of said measurement resistive two-terminal network by a factor of at least 10.

Said control device may be adapted: to connect said calibration resistor in parallel with said conductive probe while it is being kept away from any conductive surface, and measure the potential difference across the terminals of the measurement resistive two-terminal network; to disconnect said calibration resistor while said conductive probe continues to be kept away from any conductive surface, and measure the potential difference across the terminals of the measurement resistive two-terminal network for all resistance values of the two-terminal network; and to calibrate said measurement circuit with the help of the measured potential difference values. The measurement circuit may thus be calibrated in very simple manner.

Said calculation unit may be adapted to calculate the logarithm of said contact resistance as a function of the voltage across the terminals of the measurement resistive two-terminal network. As a general rule, resistance images are represented on a logarithmic scale. That requires the non-linear compression function performed by the voltage divider to be inverted, the resistance value of the contact to be determined, and its logarithm (usually its decimal logarithm) to be calculated. These operations can be performed very simply by a dedicated digital circuit or by a computer.

Said DC voltage source may be an adjustable voltage source. Under such circumstances, in a particular embodiment of the invention, said control device may be adapted to control said DC voltage source so as to keep the potential difference between said sample and said conductive probe constant independently of the value of said contact resistance.

The potential difference across the terminals of the measurement resistive two-terminal network may be read by an amplifier having high input impedance and presenting positive feedback via a capacitor so as to compensate for the stray capacitance of the measurement circuit.

The apparatus may also include a conductive probe connected to said measurement circuit; this probe may be selected from an atomic force microscopic tip, a profile meter stylus, and a tribometer pin. This list is not limiting.

The apparatus may also include a second control device for controlling an actuator for causing the conductive probe to move relative to the surface of the sample, and for receiving from said measurement circuit said signal representative of a contact resistance so as to acquire simultaneously a topographic image and a local resistance image of said surface.

Other characteristics, details, and advantages of the invention appear on reading the following description made with reference to the accompanying drawings given by way of example, and in which.

Figure 1:
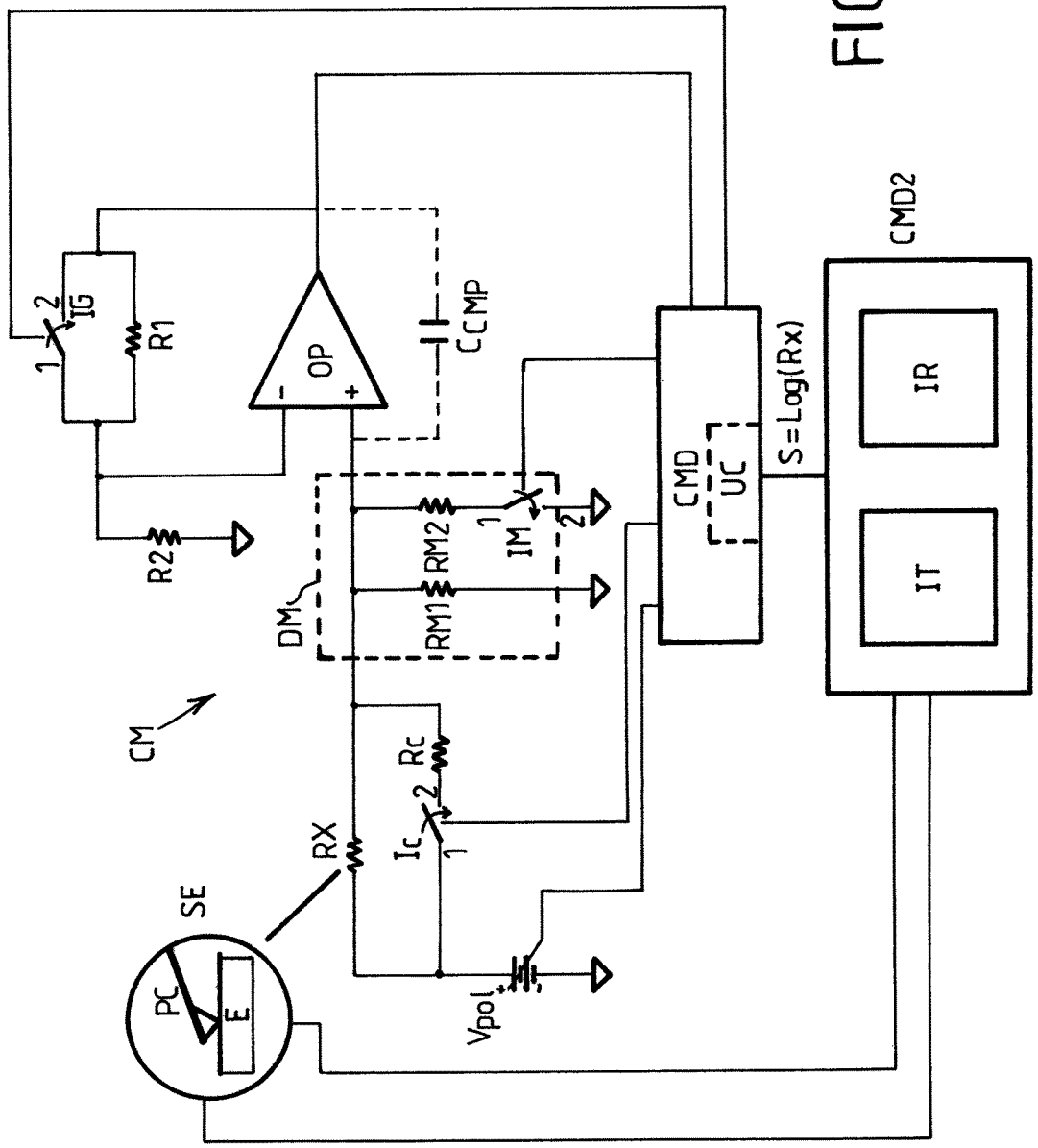
FIG. 1 is a diagram of an apparatus in an embodiment of the invention.

As shown in FIG. 1, a conductive probe PC is put into contact with the surface SE for characterizing of a sample E. The conductive probe may be an atomic force microscope tip; in a variant, if lower spatial resolution suffices, it may be a profile meter stylus or a tribometer pin; below, consideration is given to the situation in which the probe is a tip. The contact resistance between the sample and the tip is written $R_x$: that is the parameter for measuring.

A voltage generator applies a bias voltage $V_{pol}$ to the sample, which voltage may possibly be variable.

A resistor $R_C$ of relatively low resistance (e.g. 100 ohms ($\Omega$), and more generally less than or equal to the smallest value of $R_x$ that it is to be possible to measure accurately), may be connected in parallel with $R_x$ or disconnected by means of a switch $I_C$, e.g. implemented in the form of a transistor. As explained below, the resistor $R_C$ is necessary for calibrating the measurement circuit CM.

The conductive tip PC is connected to ground via a resistive two-terminal network $D_M$, referred to as a "measurement" network and characterized by a resistance $R_{DM}$. Thus, the contact resistance $R_x$ and the resistive two-terminal network form a voltage divider. The potential difference $V_s$ across the terminals of the resistive two-terminal network $D_M$ is given by:

$$V_s = \frac{R_{DM}}{R_{DM} + R_x} V_{pol}$$

Figure 2:
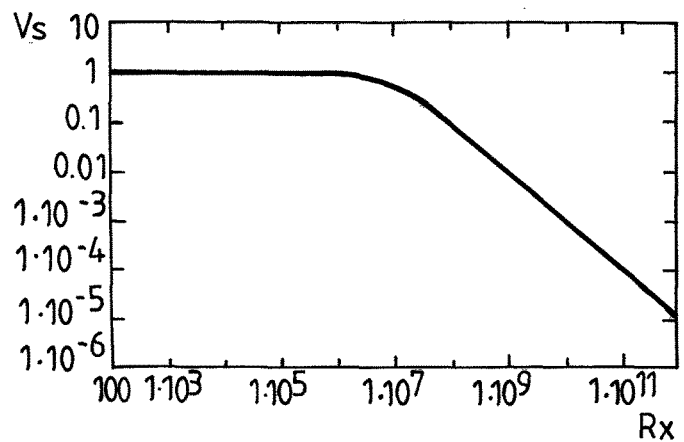
FIG. 2 is a graph plotting the dynamic range compression function performed by the voltage divider.

The graph of the function that expresses $V_s$ as a function of $R_x$ is shown on a log-log scale in FIG. 2 for $V_{pol}=1$ volt (V) and for $R_{DM}=10$ megaohms (M$\Omega$). It can be seen that it is a function that is non-linear and decreasing, thus making it possible to compress variation in $R_x$, thereby extending the range of measurable values of $R_x$ by one or two decades.

Nevertheless, it should be observed that $V_s$ varies very little for values of $R_x$ less than $10^4 \Omega$ (10 kiloohms (k$\Omega$)); and a resistance $R_{DM}$ of 10 M$\Omega$ is too high to enable "low" values of $R_x$ to be measured accurately.

In order to solve this problem, the invention provides for using a measurement resistive two-terminal network $D_M$ of resistance that is variable, and in particular of resistance that can be varied in steps. A simple and effective way of making a variable resistive two-terminal network consists in connecting two or more resistors of different resistances in parallel, the resistors being connected to ground via respective switches (the resistor of highest resistance may be permanently connected to ground). In the example of FIG. 1, use is made of a resistor $R_{M1}$ having a resistance of 10 M$\Omega$ ($10^7 \Omega$) that is permanently connected to ground, and a resistor $R_{M2}$ of 10 k$\Omega$ ($10^4 \Omega$) that is connected to ground via a switch $I_M$. It can readily be understood that when $I_M$ is open, $R_{DM}=R_{M1}=10$ M$\Omega$, whereas when $I_M$ is closed, $R_{DM} \approx R_{M2}=10$ k$\Omega$.

By way of example, the switch $I_M$ may be implemented in the form of a junction gate field-effect transistor (JFET). The change in the resistance of the measurement two-terminal network $D_M$ may take place very quickly; the stray capacitances that are inevitably present always have a path via which they can discharge, and in the worst circumstances they can discharge via the resistor $R_{M1}$. The magnitude of these capacitances lies typically in the range 1 picofarad (pF) to 10 pF, thereby leading to time constants lying in the range 10 microseconds ($\mu$s) to 100 $\mu$s for $R_{M1}=10$ M$\Omega$.

The voltage $V_s$ is read by an amplifier having high input impedance (input impedance greater than ten times the highest value of $R_x$ that it is desired to measure, i.e. greater than $10^{12}\Omega$ or $10^{13}\Omega$ in the embodiment considered herein) in order to avoid disturbing the measurement. In the example of FIG. 1, this amplifier presents gain that is variable: it can easily be seen that when the switch $I_G$ is closed, the operational amplifier OP is connected as a voltage follower (gain G=1), whereas when $I_G$ is open, the gain is given by $G=R_1/R_2$ (below it is assumed that when $I_G$ is open, G=10). The gain is adjusted as a function of the bias voltage $V_{pol}$ and of $R_{DM}$ in such a manner as to avoid saturating the amplifier and/or the acquisition and processing electronics connected downstream therefrom.

Optionally, a capacitor $C_{CMP}$ may be connected between the output and the non-inverting input ("+") of the operational amplifier in order to provide positive feedback that serves to compensate at least in part for the stray capacitance at the input to the amplifier and subsequently to increase the speed with which signals are acquired. It is important to emphasize that there exists a relationship that is indirect but essential between the measurement dynamic range and the speed of acquisition. The measurement dynamic range may be extended to high resistances by increasing the maximum value that can be measured using the resistance $R_{DM}$ of the two-terminal network. However, in so doing, the acquisition speed is reduced, since the stray capacitances need to discharge through a higher resistance. In practice, there is some minimum acceptable acquisition speed, in particular when it is desired to make a resistance image having several thousands or even several tens of thousands of points. Ultimately, the need to find a compromise between acquisition speed and the measurement dynamic range puts practical limits on the dynamic range.

The output voltage from the amplifier, equal to $G \cdot V_s$, is delivered via an analog-to-digital acquisition and conversion card (not shown) to a calculation unit UC that calculates $R_x$ by inverting the dynamic range compression function:

$$R_x = \left(\frac{V_{pol}}{V_s} - 1\right) R_{RM}.$$

The calculation unit preferably does not deliver the resistance $R_x$ as its output signal S, but rather its logarithm (in particular its decimal logarithm) $Log(R_x)$, or more generally a value that is proportional to the logarithm ($a+b \cdot Log(R_x)$). Resistance images are generally shown on a logarithmic scale.

The calculation unit UC is preferably implemented in digital form. It may be a dedicated digital circuit, or more advantageously, it may be an acquisition card connected to a computer that is programmed appropriately, or indeed a digital signal processor ("DSP") card. The output signal S may be analog, or more advantageously it may be digital.

The acquisition card presents resolution, and thus an input dynamic range, that is variable. Given that a change in resolution is equivalent to modifying an equivalent input gain, reference is made to the "gain" GC of the acquisition card. GC should not be confused with G, where G is the real gain of an analog amplifier situated upstream from the acquisition card.

Figure 3:
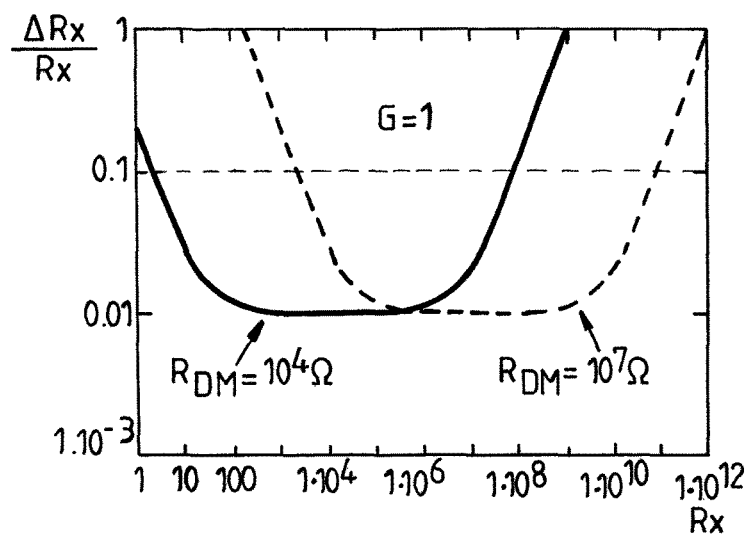
FIGS. 3 and 4 are two graphs showing how measurement uncertainty depends on the value of the contact resistance.

FIG. 3 is a log-log graph of the theoretical measurement uncertainty $\Delta R_x/R_x$ calculated for: 1% tolerance for the resistances $R_{M1}$ and $R_{M2}$ (and thus of $R_{DM}$); $V_{pol}$=1V; relative uncertainty concerning $V_{pol}$, $\Delta V_{pol}/V_{pol}=10^{-5}$; measurement uncertainty concerning $V_s$, $\Delta V_s/V_s=10^{-5}$; and G=1 (operational amplifier connected as a voltage follower). This uncertainty is given by:

$$\frac{\Delta R_x}{R_x} = \frac{\Delta R_{DM}}{R_{DM}} + \left(1 + \frac{R_{DM}}{R_x}\right) \times \frac{\Delta V_{pol}}{V_{pol}} + \frac{(R_x + R_{DM})^2}{R_x \cdot R_{DM}} \times \frac{\Delta V_s}{V_{pol}}$$

The continuous line applies to the situation in which the contact resistance $R_x$ is in series with the lower measurement resistance $R_{M2}$=10 k$\Omega$; the dashed line relates to the situation in which the contact resistance $R_x$ is in series with the higher measurement resistance, $R_{M1}$=10 M$\Omega$. It can be seen that the measurement uncertainty remains below 10% for values of $R_x$ lying in the range a few $\Omega$ to $10^{11}\Omega$, i.e. over almost 11 decades.

If it is not possible to change the resistance of the measurement resistive two-terminal network, then the dynamic range of the measurement (with uncertainty of less than 10%) would be about eight decades, and in fact less than that because of effects that are ignored in the above theoretical analysis, and in particular because of noise.

It should be observed that measurement uncertainty is at a minimum for $R_x=R_{DM}$, and remains almost constant for about four decades, after which it increases symmetrically for large and small values of $R_x$. Consequently, the greater the maximum resistance that it is desired to measure accurately, the greater the maximum value of $R_{DM}$ that must be available, it being understood—as explained above—that using a high measurement resistance leads to a penalty in terms of acquisition speed. In the presently described example, an acquisition time per point of about 0.5 ms has been demonstrated.

Figure 4:
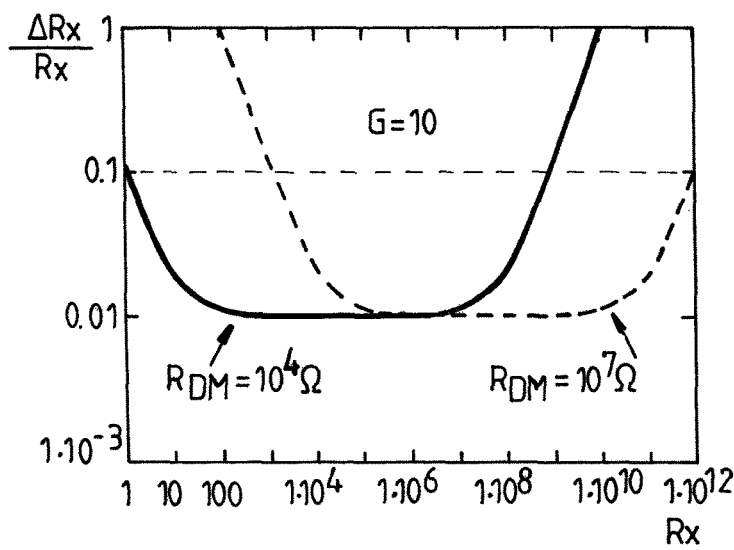

FIG. 4 is a graph of the measurement uncertainty when G=10, all of the other parameters remaining unchanged. It can be seen that this makes it possible to measure resistances of up to $10^{12}\Omega$ with uncertainty that is less than or equal to 10%. Under such circumstances, the dynamic range covers 12 decades. The effect of an amplification factor G greater than 1 is of increasing benefit with decreasing bias voltage (which is sometimes made necessary by the characteristics of the sample). It is also possible to use gains greater than 10 in order to measure high values of surface resistance $R_x$. Nevertheless, increasing the gain has an unfavorable effect on the noise that affects the measurement signal. It is therefore not possible to increase the measurement dynamic range without limit merely by acting on gain.

The above-described measurement circuit CM is controlled by a control device CMD, which may in particular be a computer or a microprocessor control card. The device causes the switches $I_c$, $I_M$, and $I_G$ to be opened and closed, and where appropriate it adjusts the value of the bias voltage $V_{pol}$ (as explained below) and the value of the gain GC of the acquisition card. The calculation unit UC may be incorporated in the control device CMD, or it may constitute a separate unit.

In the embodiment of the invention described herein, the apparatus constituted by the measurement circuit, the bias source, and the control device CMD is associated with an atomic force microscope in which the tip PC is used as a conductive probe for measuring the local resistance of the surface of the sample. A second control device CMD2 controls the movement of the conductive tip PC over the surface SE (usually, by moving the sample E by means of a piezoelectric actuator that is not shown), thereby acquiring topographical information coming from said conductive tip together with the signal S delivered by the calculation unit UC, and generating a point by point topographic image IT and a resistance image IR of the surface SE.

In a variant, the functions performed by the control devices CMD and CMD2 may be performed by a single control device.

In various different embodiments, the apparatus of the invention may be coupled, for example, to a profile meter, to a tribometer, or it may be implemented in the form of an independent device.

Figure 5:
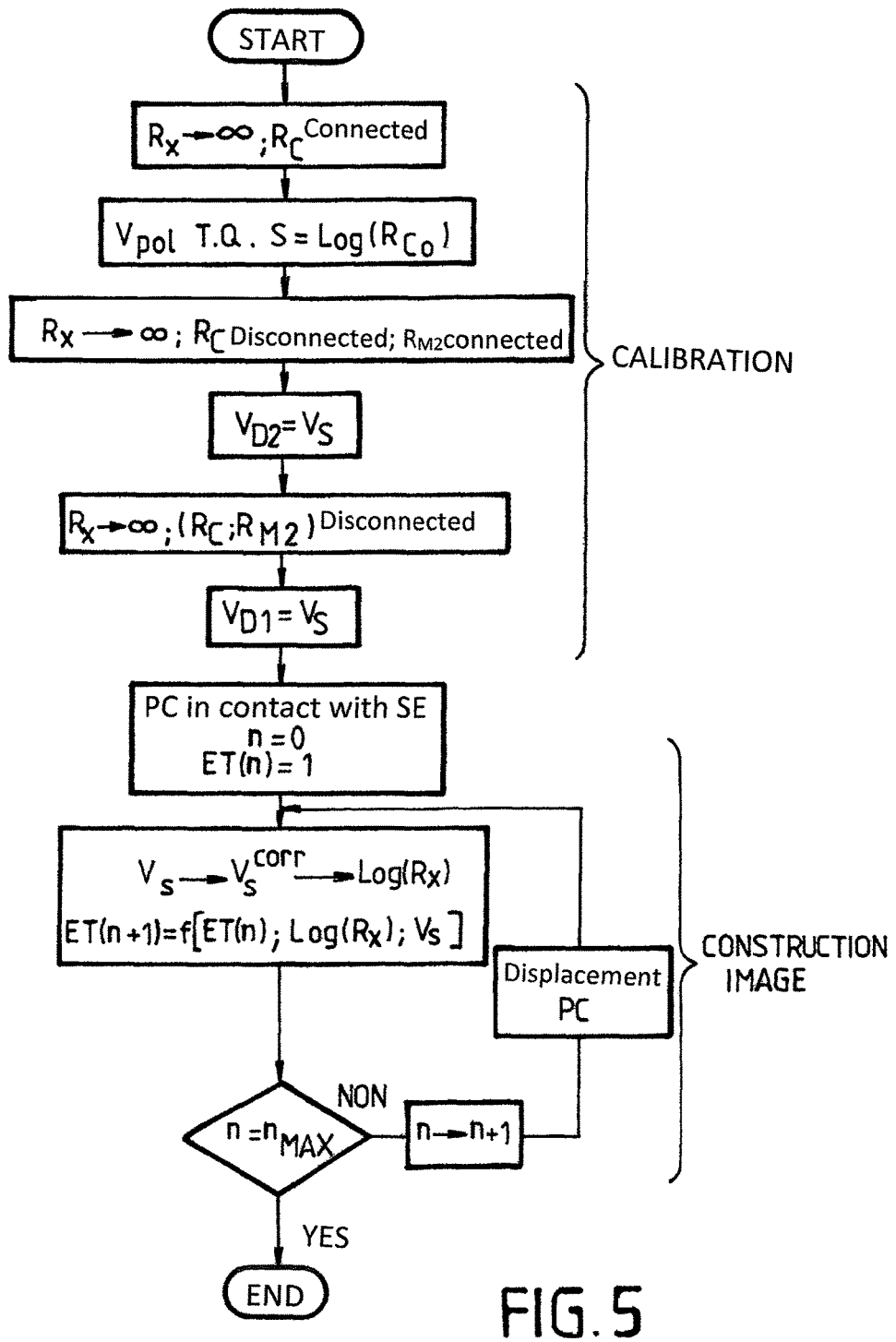
FIG. 5 is a flow chart of the program for controlling the measurement circuit of the FIG. 2 apparatus.

FIG. 5 is a flow chart of a program for controlling the measurement circuit, which program may be executed by the control device CMD. The program includes a calibration sequence followed by a sequence of acquiring measurements and of constructing a resistance image.

Prior to the calibration, the bias voltage $V_{pol}$ (whose value may be modified a little in order to perform calibration), the equivalent gain GC of the acquisition card, and the gain G of the input amplifier are determined. The latter parameter is set manually, generally as a function of $V_{pol}$ in order to avoid any risk of saturating the acquisition card. For example, it is possible to set G=1 for $V_{pol}$>1V, and otherwise G=10.

The calibration sequence is performed by keeping the conductive tip PC away from any surface (or in contact with an insulating surface), such that $R_x \to \infty$.

In a first calibration step, the switch $I_C$ is closed such that a standard resistance $R_C$ (100Ω) is connected and acts as the resistance $R_x$ to be measured, thereby enabling the measurement circuit to be calibrated for low values of this resistance. Since $R_C$ is known, the expected value for the output signal S is also known; for example if S=Log($R_x$), its expected value during the calibration step is 2 (a pure number for a digital signal; 2V for an analog signal). In general, the real value of S will differ from the expected value. Nevertheless, it is possible to act on a calibration parameter of the measurement circuit so that S(real)=S(expected). Preferably, the calibration parameter is the bias voltage $V_{pol}$. In a variant, it is possible to act on one or more parameters of a linearization function, or on values contained in a correspondence table.

This very simple technique makes it possible to adjust effectively the offset observed on the measurements of low resistances by varying $V_{pol}$ by a few percent only, or even less. The bias voltage may be adjusted for the purpose of compensating errors by means of a proportional-integral type feedback loop. However, this compensation procedure based on varying bias can give rise to large errors if the bias voltage is too small, e.g. less than 10 millivolts (mV).

In a second calibration step, $R_C$ is disconnected while maintaining $R_x \to \infty$, and the switch $I_M$ is closed so as to connect $R_{M2}$ to the input of the operational amplifier. The idea is to measure the voltage offset $V_{D1}$ present at the output from said amplifier for $R_{DM}=R_{M2}$.

Thereafter, the switch $I_M$ is opened and the offset $V_{D2}$ present at the output from the amplifier OP is measured for $R_{DM}=R_{M1}$.

If there are more than two measurement resistors, then these steps are repeated as many times as necessary.

Once the calibration sequence has been completed, it is possible to begin acquiring resistance measurements. The tip PC is put into contact with the surface SE and a counter n is initialized to zero.

During the measurement sequence, the measurement circuit is then in one of the following three states ET:

ET=1: $R_{DM}=R_{M2}$=10 kΩ; GC=1;
ET=2: $R_{DM}=R_{M2}$=10 kΩ; GC=8; and
ET=3: $R_{DM}=R_{M1}$=10 MΩ; GC=8;

(the state: $R_{DM}=R_{M1}$=10 MΩ; GC=1 is theoretically possible but of little use). It is assumed that ET=1 at the beginning of the sequence, but this selection is arbitrary.

The calculation unit UC reads the voltage $G \cdot V_s$ at the output from the amplifier, divides it by the gain G, corrects it by subtracting the offset ($V_{D1}$ or $V_{D2}$, depending on the state ET of the measurement circuit), and uses the corrected value $V_s^{corr}$ to calculate the output signal S=Log($R_x$).

Thereafter, the control device decides what is to be the state of the circuit at step n+1 of the sequence, as a function of its state at step n, as a function of the measured value for Log($R_x$), and possibly as a function of the measured voltage $V_s$ (a small value for $V_s$ making it desirable to use a high acquisition card gain GC). It is possible to write:

$$ET(n+1)=f[ET(n); Log(R_x); V_s]$$

Figure 6A:
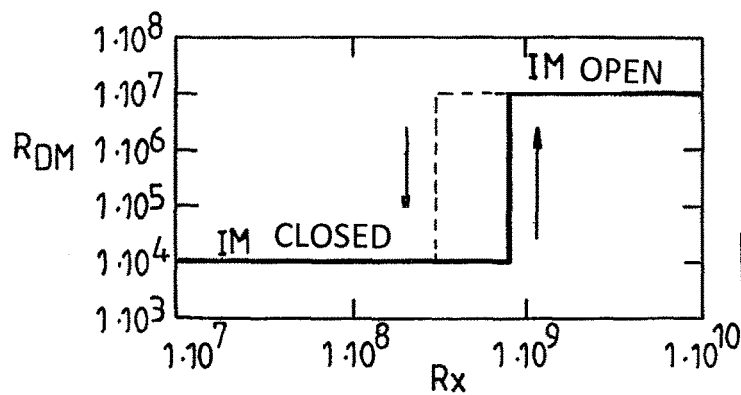
FIG. 6A shows the control relationship with hysteresis that is used for automatically changing the resistance of the measurement resistive two-terminal network.

In reality, "f" is not a function in the mathematical sense of the term, but a control relationship with hysteresis. Ignoring for the moment the dependency of $V_s$, this control relationship is as shown in FIG. 6A.

Figure 6B:
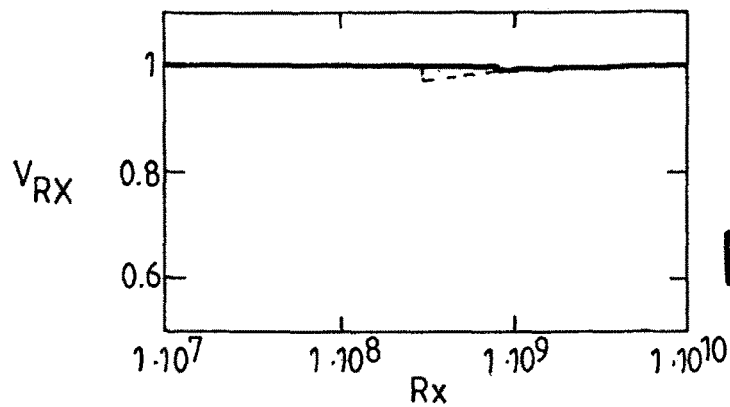
FIG. 6B is a graph of the voltage across the terminals of the contact resistance to be measured as a function of the value of said resistance.

It is assumed that $R_x$ initially has a "low" value of less than 10 kΩ. Under such conditions, the switch $I_M$ should be closed, so that $R_{DM}=R_{M2}$=10 kΩ. Thereafter, $R_x$ begins to increase. The switch $I_M$ remains closed until $R_x$ exceeds the value $R_{Th1}$=600 MΩ; at this point the switch is opened so that $R_{DM}=R_{M2}$=10 MΩ. Thereafter, $R_x$ begins to decrease. The switch $I_G$ remains open so long as $R_x$ does not drop below the value $R_{Th2}$=300 MΩ, after which it closes. There is thus hysteresis, as shown in FIG. 6A. It should be observed that the uncertainty of measurements depends very little on $R_{DM}$ for $R_x$ lying in the range $R_{M2}$ to $R_{M1}$. FIG. 6B shows that switching the resistance gives rise to only a very small variation in the voltage $V_{RX}$ across the terminals of the contact resistance, and thus of the measurement voltage $V_s$.

If the counter n has reached the maximum value $n_{MAX}$, indicating that a complete image has been acquired, then the program stops. Otherwise, n is incremented by unity, the tip PC is moved relative to the surface SE (in reality it is usually the sample that is moved with the tip remaining stationary; but what matters is relative movement) and the measurement sequence begins again so as to enable a local value of said surface resistance to be acquired matching the new contact point of the tip PC. In a variant, the program may run continuously, in which case the counter n is not necessary.

In a variant, it is possible to vary the bias voltage $V_{pol}$ during each acquisition in order to reveal and characterize any non-linearity in the resistance $R_x$.

Figure 7:
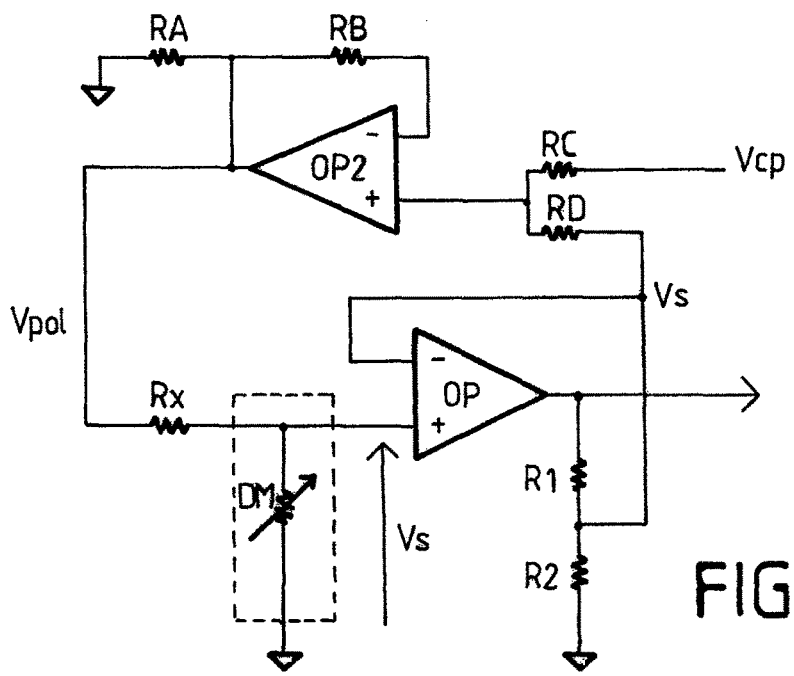
FIG. 7 is a diagram of a circuit for ensuring a constant potential difference between the sample and the conductive tip.

A drawback of the measurement circuit in FIG. 1 is that the potential difference between the surface and the conductive tip is not completely constant, but depends on $R_x$. This may lead to erroneous measurements, if the resistance $R_x$ is non-linear. That is why it may be advantageous to use a variant of the measurement circuit, as shown in FIG. 7, that makes it possible to keep the potential difference between the sample and the tip (i.e. the voltage drop $V_{RX}$ across the terminals of $R_x$) constant and equal to a setpoint $V_{CP}$ coming from the control device CMD. Under such conditions, $V_{pol}$ is no longer constant, and the calculation unit UC needs to take account of $V_{pol}$ in order to determine Log($R_x$) correctly.

In this embodiment of the apparatus of the invention, the bias voltage source is replaced by an operational amplifier OP2 connected in a non-inverting configuration with gain equal to 2, i.e. $R_A=R_B$. The resistors $R_C$ and $R_D$ at the non-inverting input of OP2 form an adder circuit. It can be shown that if $R_A=R_B=R_C=R_D$, then $V_{pol}=V_{CP}+V_s$. The operational amplifier OP imposes the following relationship:

$$V_{pol} = \frac{V_{CP}(R_x + R_{DM})}{R_x} = V_{CP}\left(1 + \frac{R_{DM}}{R_x}\right).$$

Under such conditions, $R_x$ is given by:

$$R_x = \frac{V_{CP}R_{DM}}{V_S}$$

The output voltage from the amplifier OP is $GV_s$, where the gain G is equal to $$G = 1 + \frac{R_1}{R_2}.$$

As with the circuit of FIG. 1, this gain may be made variable by providing a switch in parallel with the resistor $R_1$.

The invention claimed is:

1. Apparatus for measuring the local electrical resistance of a surface, the apparatus comprising:
 a conductive probe suitable for coming into contact with a surface (SE) of a sample (E) for characterizing,
 a measurement circuit (CM) capable of being connected to the conductive probe in order to generate a signal (S) representative of a contact resistance ($R_x$) between said conductive probe and said surface of the sample;
 a DC voltage source for applying a bias voltage (Vpol) to said sample (E) and to said measurement circuit when said measurement circuit is connected to the conductive probe;
 a control device (CMD) connected to the measurement circuit for controlling said measurement circuit;
 the measurement circuit comprising:
 a measurement resistive two-terminal network ($D_M$) presenting variable resistance and connected between said conductive probe and a ground of the circuit when said measurement circuit is connected to the conductive probe, such that the contact resistance and the two-terminal network form a voltage divider;
 the apparatus further comprising a calculation unit (UC) for generating said signal representative of the contact resistance between said conductive probe and said surface of the sample as a function of a voltage ($V_S$) which appears across the terminals of said measurement resistive two-terminal network as a consequence of applying said bias voltage and;
 the apparatus being characterized in that said apparatus includes a calibration resistor ($R_c$) connected in parallel with the contact resistance or disconnected by means of a switch (Ic) with the assembly constituted by said sample and said conductive probe; and
 said control device being adapted:
 to connect said calibration resistor in parallel with said conductive probe while it is being kept away from any conductive surface, and measure the potential difference across the terminals of the measurement resistive two-terminal network;
 to disconnect said calibration resistor while said conductive probe continues to be kept away from any conductive surface, and measure the potential difference across the terminals of the measurement resistive two-terminal network for all resistance values of the two-terminal network; and
 to calibrate said measurement circuit with the help of the measured potential difference values.

2. Apparatus according to claim 1, wherein said measurement resistive two-terminal network presents resistance that is variable in steps.

3. Apparatus according to claim 1, wherein said measurement resistive two-terminal network presents a plurality of measurement resistors ($R_{M1}$, $R_{M2}$) of decreasing resistances, at least one of which may be connected or disconnected selectively between said conductive probe and ground.

4. Apparatus according to claim 1, wherein said measurement resistive two-terminal network presents resistance that is continuously variable.

5. Apparatus according to any preceding claim, wherein said control device is adapted to modify the resistance of said resistive two-terminal network as a function of a previously measured value of said contact resistance so as to match the measurement range of the apparatus to the resistance for measurement.

6. Apparatus according to claim 5, wherein said control device is adapted to modify the resistance of said resistive two-terminal network in application of a control law with hysteresis.

7. Apparatus according to claim 1, wherein said calibration resistor presents resistance that is less than the minimum value of the resistance of said measurement resistive two-terminal network by a factor of at least 10.

8. Apparatus according to claim 1, wherein said calculation unit is adapted to calculate the logarithm of said contact resistance as a function of the voltage across the terminals of the measurement resistive two-terminal network.

9. Apparatus according to claim 1, wherein said DC voltage source is an adjustable voltage source (OP2).

10. Apparatus according to claim 9, wherein said control device is adapted to control said DC voltage source so as to keep the potential difference ($V_{CP}$) between said sample and said conductive probe constant independently of the value of said contact resistance.

11. Apparatus according to claim 1, wherein the potential difference across the terminals of the measurement resistive two-terminal network is read by an amplifier (OP) having high input impedance and presenting positive feedback via a capacitor ($C_{CMP}$) so as to compensate for the stray capacitance of the measurement circuit.

12. Apparatus according to claim 1 characterized in that the conductive probe is selected from an atomic force microscopic tip, a profile meter stylus, and a tribometer pin.

13. Apparatus according to claim 1 wherein the calculation unit is incorporated in the measurement circuit.

14. Apparatus according to claim 1, wherein the calculation unit is incorporated in the control device.

15. Apparatus for measuring the local electrical resistance of a surface, the apparatus comprising:
 a conductive probe suitable for coming into contact with a surface (SE) of a sample (E) for characterizing,
 a measurement circuit (CM) capable of being connected to the conductive probe in order to generate a signal (S) representative of a contact resistance between said conductive probe and said surface of the sample;
 a DC voltage source for applying a bias voltage (Vpol) to said sample (E) and to said measurement circuit when said measurement circuit is connected to the conductive probe;
 a control device (CMD) connected to the measurement circuit for controlling said measurement circuit;
 the apparatus being characterized in that said measurement circuit comprises:

a measurement resistive two-terminal network ($D_M$) presenting variable resistance and connected between said conductive probe and a ground of the circuit when said measurement circuit is connected to the conductive probe, such that the contact resistance and the two-terminal network form a voltage divider; and the apparatus further comprises a calculation unit (UC) for generating said signal representative of the contact resistance between said conductive probe and said surface of the sample as a function of a voltage ($V_S$) which appears across the terminals of said measurement resistive two-terminal network as a consequence of applying said bias voltage, and also including a calibration resistor ($R_C$) connected in parallel or disconnected by means of a switch (Ic) with the assembly constituted by said sample and said conductive probe.

* * * * *

UNITED STATES PATENT AND TRADEMARK OFFICE
CERTIFICATE OF CORRECTION

| | |
|---|---|
| PATENT NO. | : 9,594,101 B2 |
| APPLICATION NO. | : 13/696125 |
| DATED | : March 14, 2017 |
| INVENTOR(S) | : Schneegans et al. |

It is certified that error appears in the above-identified patent and that said Letters Patent is hereby corrected as shown below:

In the Claims

Column 9,
Line 30, in Claim 1: after "sample" insert --when the measurement circuit is connected to the conductive probe--.

Signed and Sealed this
Sixteenth Day of January, 2018

Joseph Matal
*Performing the Functions and Duties of the*
*Under Secretary of Commerce for Intellectual Property and*
*Director of the United States Patent and Trademark Office*